(12) United States Patent
Kirimura

(10) Patent No.: US 6,391,114 B1
(45) Date of Patent: May 21, 2002

(54) VACUUM PROCESSING APPARATUS

(75) Inventor: Hiroya Kirimura, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/567,077

(22) Filed: May 8, 2000

Related U.S. Application Data

(63) Continuation of application No. PCT/JP99/05011, filed on Sep. 13, 1999.

(30) Foreign Application Priority Data

Sep. 21, 1998 (JP) .............................. 10-266359

(51) Int. Cl.$^7$ ........................... C23C 16/00; H05H 1/00
(52) U.S. Cl. .................... 118/719; 118/730; 156/345.31
(58) Field of Search ................................. 118/719, 730, 118/715, 727, 729, 737, 66; 156/345.31, 345.32

(56) References Cited

U.S. PATENT DOCUMENTS

| | | | | |
|---|---|---|---|---|
| 5,505,779 A | * | 4/1996 | Mizuno et al. | 118/719 |
| 5,512,320 A | * | 4/1996 | Turner et al. | 427/255 |
| 6,079,928 A | * | 6/2000 | Theriault et al. | 414/217 |
| 6,277,199 B1 | * | 8/2001 | Lei et al. | 118/696 |

FOREIGN PATENT DOCUMENTS

| | | |
|---|---|---|
| JP | 03274746 | 12/1991 |
| JP | 04240721 | 8/1992 |
| JP | 10012695 A | 1/1998 |
| JP | 10-55972 | 2/1998 |
| JP | 2965038 | 8/1999 |

* cited by examiner

*Primary Examiner*—Gregory Mills
*Assistant Examiner*—P. Hassanzadeh
(74) *Attorney, Agent, or Firm*—Arent Fox Kintner Plotkin and Kahn, PLLC

(57) ABSTRACT

The invention provides a vacuum processing apparatus, in which a substantial installation area is smaller than that of a conventional vacuum processing apparatus having a plurality of processing chambers of the same size and the same number, and easy maintenance can be achieved. More specifically, the invention provides a vacuum processing apparatus including a plurality of processing chambers, which are provided with processing devices for effecting predetermined processing on a target object, can achieve predetermined internal pressures, and can accommodate the target object for effecting predetermined processing under the predetermined pressures. In the vacuum processing apparatus, the plurality of processing chambers are arranged around a central chamber provided for object transfer and being capable of achieving a predetermined internal pressure, and are connected with the central chamber. The plurality of processing chambers are disposed on two or more vertically different levels, and each of the processing chambers and a processing chamber neighboring thereto in the circumferential direction of the central chamber are disposed on different levels, respectively, and overlap only partially each other.

15 Claims, 10 Drawing Sheets

VACUUM PROCESSING APPARATUS

This application is a continuation of International Application No. PCT/JP99/05011, filed Sep. 13, 1999.

TECHNICAL FIELD

The present invention relates a vacuum processing apparatus including a plurality of processing chambers, which are provided with processing devices for effecting predetermined processing on an internally arranged target object to be processed under a predetermined pressure and can achieve predetermined internal pressures.

BACKGROUND ART

Semiconductor devices such as a semiconductor memory, a TFT for a liquid crystal display and a MPU are produced by effecting several kinds of processing on a substrate (i.e., an object to be processed) in a predetermined order. For example, the substrate is subjected to (1) processing of forming a film of a predetermined material on the substrate by a PVD method such as a sputtering vapor deposition method or an ion plating method, or a CVD method such as a plasma CVD method, (2) etching for removing a predetermined material from the substrate by a dry etching method such as an ECR plasma etching method, and (3) processing of implanting predetermined ions into the substrate by a doping method such as a plasma doping method. These film formation, dry etching and doping are usually performed under a pressure lower than an atmospheric pressure.

Therefore, a vacuum processing apparatus for effecting such processing is provided with a processing chamber in which a predetermined pressure can be achieved. The processing chamber is provided with a processing device for effecting predetermined processing on the substrate disposed in the chamber.

For effecting two or more kinds of processing on the same substrate, a plurality of vacuum processing apparatuses each provided with, e.g., only one processing chamber are prepared, and these vacuum processing apparatuses are used to effect successively the several kinds of predetermined processing on the substrate.

For effecting the several kinds of processing on the same substrate, the substrate which is subjected to predetermined processing in a certain vacuum processing apparatus is transferred to another vacuum processing apparatus for the next processing. During this transfer, the substrate is exposed to an atmosphere so that the substrate may be polluted with dust adhering onto the substrate or due to oxidization of the substrate. Particularly, in manufacturing processes of semiconductor devices, it is especially necessary to avoid mixing of impurities such as dust, and therefore the vacuum processing apparatuses are usually disposed in a clean room. However, it may be difficult to prevent pollution of the substrate even in the clean room. Therefore, pretreatment such as cleaning of the substrate prior to processing must be done that requires time and efforts, resulting in low efficiency.

For improving productivity by performing the several kinds of processing in a predetermined order, such a vacuum processing apparatus has already been proposed that is provided with a plurality of chambers for suppressing adhesion of dust or the like to the substrate and pollution of the substrate.

FIG. 8 shows a schematic plan of an example of a vacuum processing apparatus provided with a plurality of processing chambers.

The vacuum processing apparatus shown in FIG. 8 includes five chambers Ci, C1, C2, C3 and Co, in which predetermined pressures can be achieved, respectively. These five chambers are connected together in series via gate valves V2, V3, V4 and V5. This vacuum processing apparatus is called a vacuum processing apparatus of an in-line type.

The chambers C1, C2 and C3 are provided with processing devices (not shown), respectively. The chambers C1, C2 and C3 are provided for effecting predetermined processing on a substrate (an object to be processed or a target object) disposed therein by the processing devices. Thus, the vacuum processing apparatus includes three processing chambers.

Among the five chambers connected in series, the chamber Ci on one end is provided with a valve V1 for transferring the substrate into the chamber Ci through it. The chamber Ci serves as an inlet chamber for the substrate. The chamber Co on the other end among the five chambers is provided with a valve V6, through which the substrate in the chamber Co can be externally discharged. The chamber Co serves as a discharging or outlet chamber for the target object.

In the vacuum processing apparatus of the in-line type, the substrate is transferred into the inlet chamber Ci, then is moved through processing chambers C1, C2 and C3, and is discharged from the outlet chamber Co. The substrate is usually held on a tray, and is transferred between the chambers by moving the tray. In each processing chamber, predetermined processing is effected on the substrate transferred thereinto so that a series of processing can be continuously effected on the substrate. Since the substrate is successively transferred through the chambers kept at low gas pressures, adhesion of dust or the like onto the substrate as well as pollution of the substrate can be suppressed more effectively than the case where similar processing is performed in three vacuum processing apparatuses each provided with only one processing chamber as described before. Further, several kinds of processing can be efficiently effected on the substrate.

However, the vacuum processing device of the in-line type suffers from the following three problems (1)–(3).

(1) The tray holding the substrate is transferred into the respective chambers together with the substrate, and is subjected to the predetermined processing together with the substrate. Therefore, in the step of, e.g., forming a film on the substrate, the film is also formed on the tray. Thereby, much dust is produced from the tray, and pollutes the substrate.

(2) When maintenance work is to be performed on one of the processing chambers or one of the processing devices provided for them, or when one of the processing devices provided for the processing chambers has a trouble, the whole functions of the vacuum processing apparatus stop because the plurality of processing chambers are coupled in series.

(3) If a large number of processing chambers are coupled for continuously performing many kinds of processing, a large area is required for installing the whole vacuum processing apparatus. As already described, the vacuum processing apparatus is usually arranged in a clean room, which requires high costs per unit area (construction, maintenance and other costs). Therefore, increase in installation areas of the vacuum processing apparatus results in increase in processing costs of each substrate. Further, it may be impossible to install the vacuum processing apparatus, which is formed of the many processing chambers coupled in one row, in an existing clean room because it is lengthy, and requires a large installation area.

For overcoming the problems of the vacuum processing apparatus of the in-line type, a vacuum processing apparatus shown in FIGS. 9(A) and 9(B) is already proposed. FIG. 9(A) is a schematic plan of the vacuum processing apparatus, and FIG. 9(B) is a schematic cross section taken along line X—X in FIG. 9(A).

The vacuum processing apparatus shown in FIGS. 9(A) and 9(B) includes eight chambers C1, C2, C3, C4, C5, C6, Ci and Co, where predetermined inner pressures can be attained. These chambers are disposed around a central chamber Cc, and are connected to the central chamber Cc via gate valves, respectively. The central chamber Cc can likewise attain a predetermined inner pressure.

Chambers C1–C6 are processing chambers provided with processing devices (not shown), respectively. The chamber Ci is an inlet chamber, and the chamber Co is an outlet chamber.

In the central chamber Cc, there is arranged a robot R which can transfer a substrate between the chamber Cc and each of the chambers C1–C6, Ci and Co.

In this vacuum processing apparatus, the substrate can be transferred to each of the processing chambers via the central chamber so that predetermined processing can be successively effected on the substrate in the respective processing chambers. A substrate holder may be arranged in each processing chamber. This structure can eliminate a substrate holding tray, which is employed in the vacuum processing apparatus of the in-line type for substrate transfer, and is transferred together with the substrate into each processing chamber. Therefore, generation of dust can be suppressed, and thereby pollution of the substrate can also be suppressed. Even when one of the processing chambers cannot be used due to maintenance work or trouble, processing to be performed in the unusable chamber can be performed in another processing chamber so that stoppage of all the functions of the vacuum processing apparatus can be avoided.

The vacuum processing apparatus shown in FIGS. 9(A) and 9(B), however, requires a large installation area for providing many processing chambers, similarly to the vacuum processing apparatus of the in-line type already described. In particular, for effecting several kinds of processing on a substrate of a relatively large area, each processing chamber must have a large size corresponding to the substrate size, and thereby the central chamber connected to the plurality of processing chambers must have a large size so that the whole installation area becomes large leading to increase in substrate processing costs.

For overcoming the above problems, Japanese Laid-Open Patent Publication No. 10-55972 proposed a vacuum processing apparatus shown in FIGS. 10(A) and 10(B). FIG. 10(A) is a schematic plan of the vacuum processing apparatus, and FIG. 10(B) is a schematic cross section of the vacuum processing apparatus taken along line X—X in FIG. 10(A).

The vacuum processing apparatus shown in FIGS. 10(A) and 10(B) includes processing chambers C1–C8 as well as the inlet chamber Ci and the outlet chamber Co. These chambers are disposed around the central chamber Cc, and each is connected to the central chamber Cc via a gate valve. The robot R is disposed in the central chamber Cc for transferring a substrate.

The vacuum processing apparatus has a two-level structure. On the first level (i.e., lower level), the processing chambers C1, C3, C5 and C7 are disposed. On the second level (i.e., upper level), the processing chambers C2, C4, C6 and C8 are disposed. The processing chambers C2, C4, C6 and C8 on the second level overlap with the processing chambers C1, C3, C5 and C7 on the first level, respectively.

The vacuum processing apparatus shown in FIGS. 10(A) and 10(B) can perform several kinds of processing similarly to the vacuum processing apparatus shown in FIGS. 9(A) and 9(B). The vacuum processing apparatus shown in FIGS. 10(A) and 10(B) has the same advantages as the vacuum processing apparatus shown in FIGS. 9(A) and 9(B). Further, the vacuum processing apparatus shown in FIGS. 10(A) and 10(B) can increase the number of processing chambers without increasing the installation area, as compared with the vacuum processing apparatus of the single level structure in FIGS. 9(A) and 9(B), because the vacuum processing apparatus shown in FIGS. 10(A) and 10(B) has the two-level structure. Therefore, substrate processing costs can be reduced.

The vacuum processing apparatus, which is taught by Japanese Laid-Open Patent Publication No. 10-55972 and is shown in FIGS. 10(A) and 10(B), suffers from the following problems (4) and (5).

(4) The processing chamber (e.g., processing chamber C2) disposed on the upper second level substantially completely overlaps with the processing chamber (e.g., processing chamber C1) disposed on the lower first level. Therefore, the processing chamber disposed on the upper second level is not provided at its bottom portion with a sufficient space for arranging another instrument, device or the like. The processing chamber may be provided at its bottom portion with a lifting device which can vertically move the substrate holder for transferring the substrate to and from the robot R in the processing chamber. The processing chamber arranged on the lower first level can be provided at its bottom portion with the lifting device having a simple lifting mechanism, but the processing chamber disposed on the upper second level cannot be provided at its bottom portion with the lifting device having a simple lifting mechanism. For the processing chamber disposed on the upper second level, therefore, a lifting device to vertically move the holder must be disposed on the side portion of the chamber. This complicates the mechanism of the lifting device leading to higher costs.

(5) The processing chambers (lower processing chambers). disposed on the lower first.level (e.g., the processing chamber C1) substantially overlap with the processing chambers (upper processing chambers) disposed on the upper second level (e.g., processing chamber C2). Therefore, the lower processing chamber is not provided at its top portion with a sufficient space for arranging another instrument, device or the like. In the top portion of the processing chamber, there may be disposed a part or the whole of the processing device for effecting predetermined processing on the substrate disposed in the chamber. The processing chamber may be provided at its top portion with a lid for performing maintenance work such as cleaning in the chamber.

It is preferable that the lid for the maintenance work is arranged at the top portion of the processing chamber for convenience of the work. However, if the processing chamber on the lower level were provided at its top portion with the lid, it would be impossible to open this lid due to existence of the processing chamber on the upper level. For opening the lid, it is necessary to move either the upper or lower processing chamber overlapping with the other by a long distance to a position where these chambers do not overlap with each other. For this, the upper or lower processing chamber must be. coupled to the central chamber via a complicated and expensive mechanism including, e.g., a rail, a pivot arm and a hinge. This results in high costs.

For opening the lid, the upper or lower processing chamber must be moved to an appropriate space (i.e., maintenance space) radially outside the processing chamber. For ensuring this maintenance space, the vacuum processing apparatus shown in FIGS. 10(A) and 10(B) requires a space larger than its projected area. Practically, the installation space of the vacuum processing apparatus shown in FIGS. 10(A) and 10(B) cannot be significantly reduced from that of the vacuum processing apparatus shown in FIGS. 9(A) and 9(B).

Accordingly, an object of the invention is to provide a vacuum processing apparatus including a plurality of processing chambers, which are provided with processing devices for effecting predetermined processing on a target object, can achieve predetermined internal pressures, and can accommodate the target object for effecting predetermined processing under the predetermined pressures, respectively. More specifically, the object of the invention is to provide the vacuum processing apparatus, in which a substantial installation area is smaller than that of a conventional vacuum processing apparatus having the plurality of processing chambers of the same size and the same number, and easy maintenance of the apparatus can be achieved.

DISCLOSURE OF THE INVENTION

For achieving the above object, the invention provides a vacuum processing apparatus including a plurality of processing chambers provided with processing devices for effecting predetermined processing on a target object to be processed, being capable of achieving predetermined internal pressures, and being capable of accommodating the target object for effecting the predetermined processing under the predetermined pressures, wherein the plurality of processing chambers are arranged around a central chamber provided for object transfer and being capable of achieving a predetermined inner pressure, and are connected with the central chamber; and the plurality of processing chambers are disposed on two or more vertically different levels, and each of the processing chambers and a processing chamber neighboring thereto in the circumferential direction of the central chamber are disposed on different levels, respectively, and overlap only partially with each other.

PREFERRED EMBODIMENTS FOR IMPLEMENTING THE INVENTION

Figure 1:
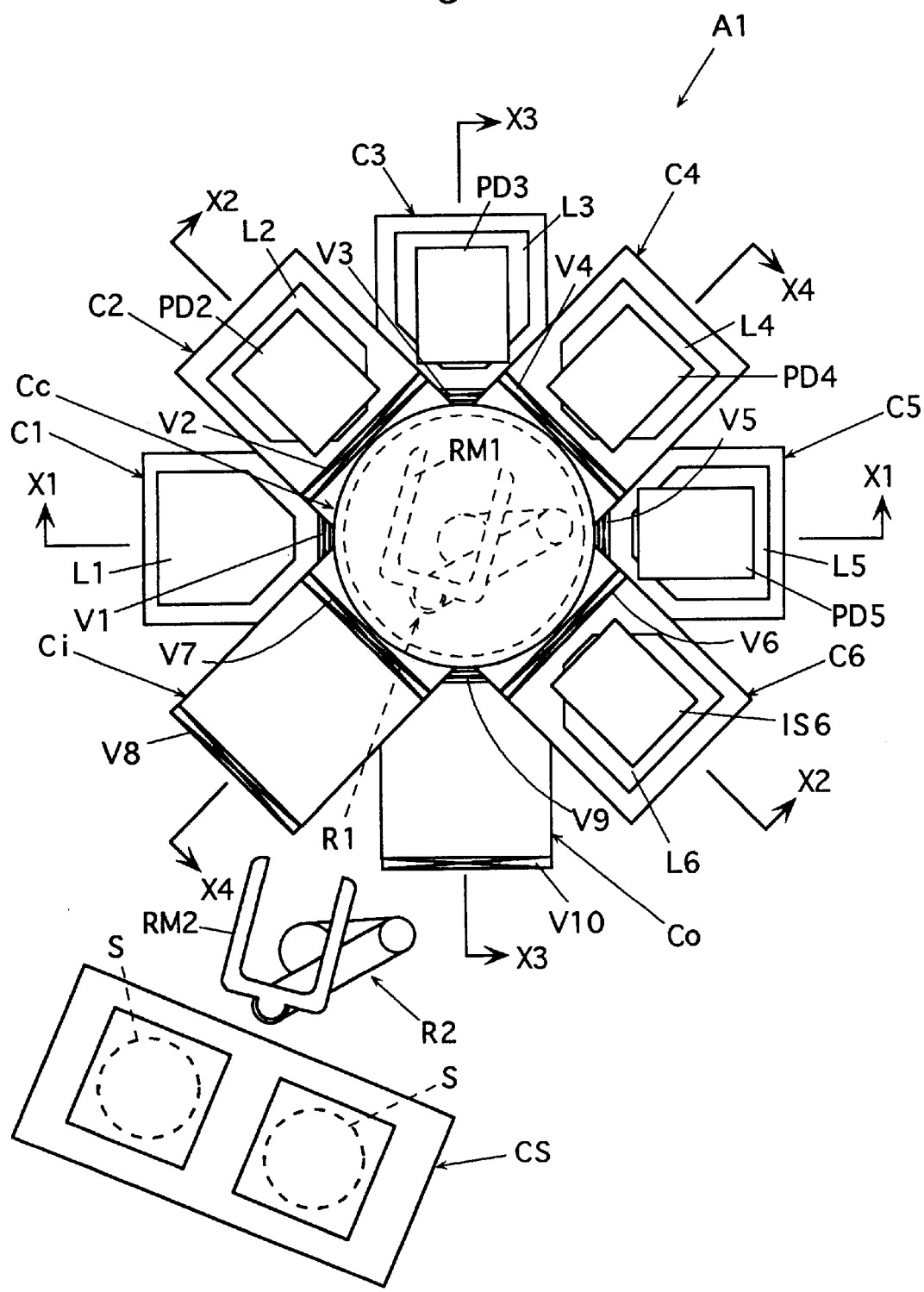
FIG. 1 is a schematic plan of an example of a vacuum processing apparatus according to the invention.
Figure 2A:
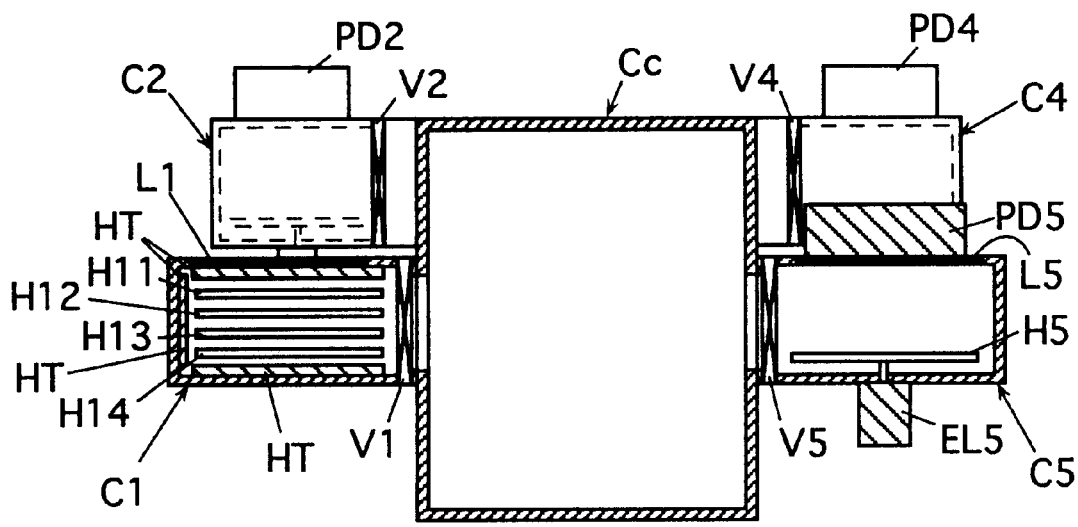
FIGS. 2(A), 2(B), 2(C) and 2(D) are schematic cross sections of the vacuum processing apparatus shown in FIG. 1 taken along lines X1—X1, X2—X2, X3—X3 and X4—X4, respectively.
Figure 2B:
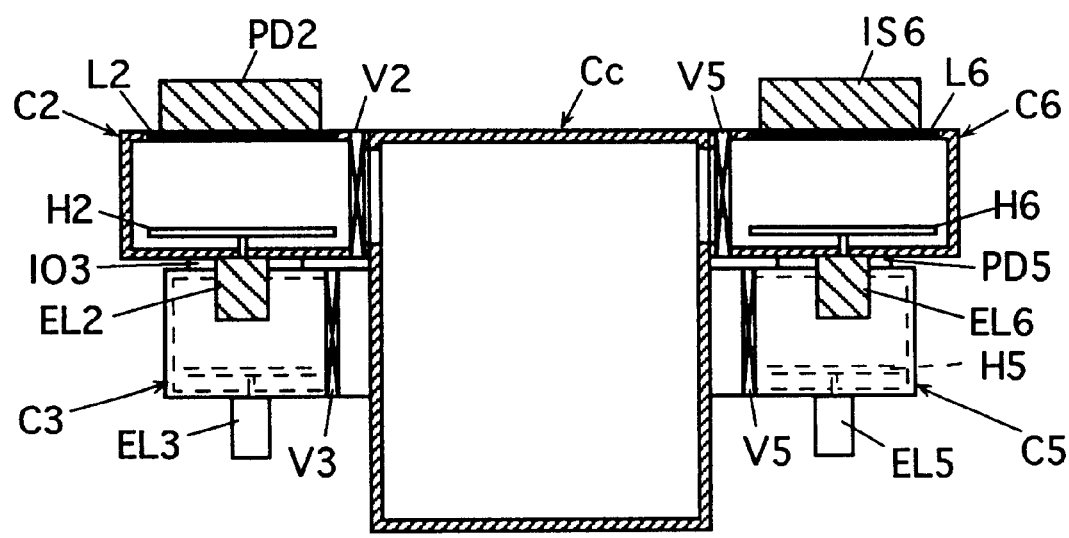
Figure 2C:
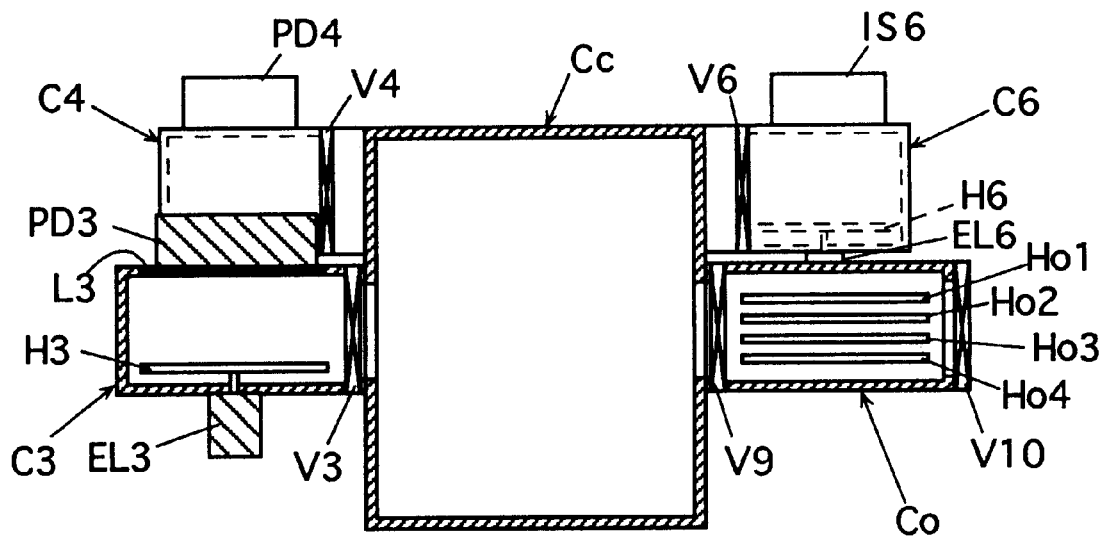
Figure 2D:
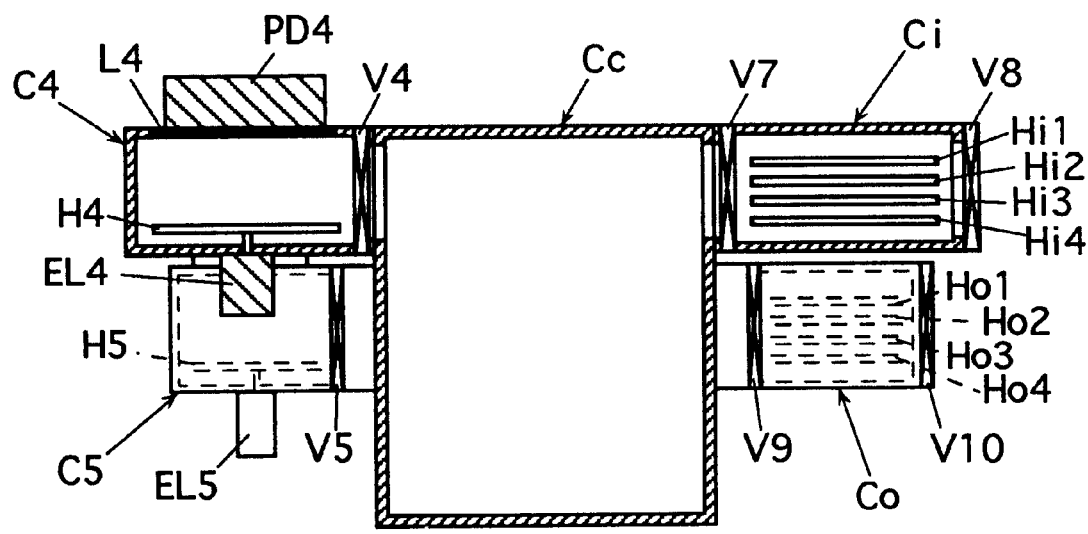

According to a preferred embodiment of the invention, a vacuum processing apparatus includes a plurality of processing chambers provided with processing devices for effecting predetermined processing on a target object to be processed, being capable of achieving predetermined internal pressures, and being capable of accommodating the target object for effecting predetermined processing under the predetermined pressures.

The plurality of processing chambers are arranged around a central chamber provided for object transfer and being capable of achieving a predetermined inner pressure, and are connected with the central chamber.

The plurality of chambers are disposed on two or more vertically different levels, and each of the processing chambers and a processing chamber neighboring thereto in the circumferential direction of the central chamber are disposed on different levels, respectively, and overlap only partially with each other.

This vacuum processing apparatus is employed for effecting predetermined one or more kinds of processing on a target object. The vacuum processing apparatus according to the invention is provided with the plurality of processing chambers. Processing is performed in each processing chamber. Processing is effected on the object typically under the condition that a predetermined pressure (a predetermined degree of vacuum) is kept in the processing chamber. Each processing chamber can be set at a predetermined internal pressure. The processing chamber is provided with a processing device for effecting predetermined processing on the target object.

The processing device may be disposed inside or outside the processing chamber. The processing device may be partially disposed inside the processing chamber, and the other portion may be disposed outside the processing chamber.

The plurality of processing chambers are disposed around the central chamber. The central chamber can likewise keep a predetermined internal pressure. Each processing chamber is connected with the central chamber. For attaining the predetermined pressure in each of the processing chambers and the central chamber independently of the others, a valve may be arranged between each of the processing chambers and the central chamber.

The plurality of chambers are disposed on two or more vertically different levels, and each of the processing chambers and a processing chamber neighboring thereto in the circumferential direction of the central chamber are disposed on different levels, respectively, and overlap only partially with each other. The state where the neighboring two chambers overlap with each other means the state where the two chambers overlap each other when the whole vacuum processing apparatus is viewed from the upper or lower position. More specifically, in the state where the neighboring two chambers partially overlap with each other, a portion of the chamber disposed on the lower level is hidden by the chamber disposed on the upper level when viewed from a higher position. The neighboring two chambers are neither completely overlapped with each other nor completely separately-seen each other. The neighboring two processing chambers overlap with each other only partially.

Since the neighboring two processing chambers partially overlap with each other, the radial size of the central chamber can be reduced, and therefore the radial size of the vacuum processing apparatus according to the invention can be reduced as compared with a conventional vacuum processing apparatus in which processing chambers equal in number to that of the invention are arranged around the central chamber, but are not on different levels, and therefore all the processing chambers are disposed on the single level.

Since the two neighboring processing chambers overlap only partially with each other, spaces are left on the top and at the bottom of each processing chamber.

Accordingly, an openable lid can be arranged, e.g., on the top portion of the processing chamber. By opening the lid on the top portion, maintenance work such as cleaning of the inside of the processing chamber or the like can be performed easily and quickly. In the conventional vacuum processing apparatus provided with the processing chambers completely overlapping with each other in the vertical direction, it is essential to move the processing chamber(s) to a large extent for opening the lid on the top of the underlying processing chamber. According to the vacuum processing apparatus of the invention, the lid can be opened without moving any other processing chamber.

The processing device for effecting predetermined processing on the target object can be entirely or partially disposed on the top or at the bottom portion of the processing chamber.

According to the vacuum processing apparatus of the invention, the target object can be successively transferred into the plurality of processing chambers through the central chamber. In each processing chamber, the processing device can effect predetermined processing on the target object. Thereby, several kinds of processing can be successively and continuously effected on the target object.

The processing devices may be a CVD device for a plasma CVD method or the like, a device for film formation by a PVD method such as vacuum deposition, an ion source, e.g., for ion implantation, a device for dry etching in an appropriate manner, a heater and/or a cooling device. A combination of these devices may be arranged in the processing chamber. In any case, each chamber is arranged to allow exhausting with an exhaust device for attaining a predetermined reduced pressure in the chamber.

If the processing device provided for the processing chamber can effect predetermined processing on a plurality of objects at a time, the processing chamber may be arranged to allow to accommodate the plurality of objects.

A heater may be arranged for the processing chamber, whereby the object can be heated to a predetermined temperature. If the heater can heat the plurality of objects at a time, the processing chamber provided with the heater may be arranged to allow to accommodate the plurality of objects. Heating may be performed as a pretreatment to be performed prior to another processing.

Independently of the above processing chamber, a pretreatment chamber dedicated to a pretreatment may be connected to the central chamber. This pretreatment chamber, where a predetermined pressure can be attained, is provided with a pretreatment device for effecting a predetermined pretreatment (e.g., heating) on the plurality of objects. The pretreatment chamber may have an increased capacity for effecting the pretreatment on many objects at a time, in which case the pretreatment chamber may be disposed over a plurality of levels. It is not necessary that the pretreatment chamber is disposed on a level different from the level of a neighboring chamber nor does it partially overlap with a neighboring chamber disposed on a different level. The pretreatment chamber may partially overlap with a neighboring chamber disposed on a different level.

The processing chamber may be provided with a cooling device for cooling the object heated to a high temperature. If the cooling device can cool the plurality of objects at a time, the processing chamber provided with the cooling device may be arranged to allow to accommodate the plurality of objects. Cooling may be a post-treatment to be performed after certain processing.

Independently of the above processing chamber, a post-treatment chamber dedicated to a post-treatment may be connected to the central chamber. This post-treatment chamber, where a predetermined pressure can be attained, is provided with a post-treatment device for effecting a predetermined post-treatment (e.g., cooling) on the plurality of objects. The post-treatment chamber may have an increased capacity for effecting the post-treatment on many objects at a time, in which case the post-treatment chamber may be disposed over a plurality of levels. It is not necessary that the post-treatment chamber is disposed on a level different from the level of a neighboring chamber nor does it partially overlap with a neighboring chamber disposed on a different level. The post-treatment chamber may partially overlap with a neighboring chamber disposed on a different level.

For example, an exhaust device and an ion source may be arranged for the processing chamber so that the exhaust device attains a predetermined pressure in the processing chamber, and an object is irradiated with predetermined ions produced from the ion source for effecting ion implantation or the like on the object.

The processing chamber may be provided with an exhaust device, a gas supply device and a gas plasma producing device. In this case, the exhaust device attains a predetermined pressure in the processing chamber, the gas supply device supplies a predetermined gas into the chamber, and the gas plasma producing device produces plasma from the gas. Thereby, a film may be formed on the object, or a predetermined material may be selectively removed from the object by etching.

The processing chamber may be provided with an exhaust device and a sputtering device. In this case, the exhaust device attains a predetermined pressure in the processing chamber, and the sputtering device performs sputtering on the sputtering target so that sputtered particles form a film on the object to be processed. Instead of the sputtering device, a vacuum deposition device or the like utilizing electron beam heating or the like may be used to form a film.

By providing various devices for the processing chambers, a film can be formed on the target object by utilizing, e.g., a PVD method such as a sputtering vapor deposition method or an ion plating method. By utilizing a CVD method such as a plasma CVD method, a film can be formed on the object. By utilizing a dry etching method such as an ECR plasma etching method, etching may be effected on an exposed material on the object. By utilizing a doping method such as a plasma doping method, predetermined ions may be implanted into the object. The vacuum processing apparatus according to the invention can successively perform the above kinds of processing, and can be utilized for manufacturing semiconductor devices such as a semiconductor memory or a TFT for a liquid crystal device. The vacuum processing apparatus according to the invention can improve surface quality of the object by utilizing an ion beam mixing method or the like.

The apparatus may be arranged such that one or more kinds of processing among the several kinds of processing to be effected on the object may be performed in parallel in the plurality of processing chambers, respectively. The plurality of processing chambers for effecting the same processing on the object may be provided with the same kind of processing devices, respectively. The plurality of processing devices performing the same processing may have portions which are used commonly, respectively. By employing the structure capable of parallel processing, a series of processing can be efficiently effected on the object, and the throughput can be increased, even if the processing requires a long time. Even when maintenance work is to be performed on one of the processing chambers and/or the processing device provided for it, or even when a trouble occurs in the processing device, the processing can be performed in another processing chamber by employing the structure capable of parallel processing. Thereby, such a situation can be reduced that the whole functions of the vacuum processing apparatus stop. For allowing such parallel processing and the like, each processing device provided for the processing chamber may be arranged to effect predetermined processing on the object independently of the other processing devices. Each chamber may be arranged to achieve a predetermined internal pressure independently of the other chambers.

The apparatus may be provided with an inlet chamber which is connected to the central chamber, and can achieve a predetermined internal pressure for transferring the object from the outside of the apparatus into the central chamber. The inlet chamber may be arranged to allow to accommodate a plurality of objects. Further, it may be arranged such that the plurality of objects can be transferred into the inlet chamber at a time.

The central chamber may be additionally provided with an outlet chamber, which can achieve a predetermined internal pressure for discharging or transferring the object from the central chamber to the outside of the vacuum processing apparatus. The outlet chamber may likewise be arranged to allow to accommodate a plurality of objects. Further, it may be arranged to allow discharging the plurality of objects at a time.

The inlet chamber may have an increased capacity for transferring a plurality of objects at a time, in which case the inlet chamber may be disposed over a plurality of levels. It is not necessary that the inlet chamber is disposed on a level different from the level of a neighboring chamber nor does it partially overlap with a neighboring chamber disposed on a different level. The inlet chamber may partially overlap with a neighboring chamber disposed on a different level. The outlet chamber may be arranged similarly to the inlet chamber.

If both the inlet and outlet chambers are connected to the central chamber, the inlet and outlet chambers may overlap with each other, and may be arranged on different levels, respectively. In case where the inlet and outlet chambers overlap with each other, the space upon one of the chambers and the space under the other chamber form dead spaces, respectively. However, it is not necessary to provide the processing devices for these two chambers, and therefore it is not necessary to provide a lid for maintenance work for these inlet and outlet chambers. Therefore, a substantial problem does not occur.

The central chamber may be provided with an object transfer robot, which can transfer the object between the central chamber and each chamber connected to the central chamber.

Embodiments of the invention are now described with reference to the drawings.

(1) A vacuum processing apparatus A1 according to a first embodiment of the invention is shown in FIG. 1 which is a schematic plan. FIGS. 2(A), 2(B), 2(C) and 2(D) are schematic cross sections of the vacuum processing apparatus A1 taken along lines X1—X1, X2—X2, X3—X3 and X4—X4 in FIG. 1, respectively.

The vacuum processing apparatus A1 is an apparatus for successively and continuously effecting a plurality of kinds of processing on a substrate S, i.e., a target object, at a low gas pressure.

The vacuum processing apparatus A1 includes a hollow cylindrical central chamber Cc as well as eight chambers C1, C2, C3, C4, C5, C6, Ci and Co, each a hollow rectangular parallelepiped form. These eight chambers are connected with the central chamber Cc.

The eight chambers arranged around the central chamber Cc are divided into two groups, which are disposed on the lower first and the upper second levels, respectively. The chambers C1, C3, C5 and Co are disposed on the lower first level. The chambers C2, C4, C6 and Ci are disposed on the upper second level.

The chambers C1, C3, C5 and Co, which are disposed on the lower first level, and are referred to as the "lower chambers" hereinafter, are disposed around the central chamber Cc, and are angularly shifted by 90 degrees. The chambers C2, C4, C6 and Ci disposed on the upper second level are disposed around the central chamber Cc, and are angularly shifted by 90 degrees. The chambers C1 and C2 are angularly shifted from each other by 45 degrees around the central chamber Cc.

Thereby, two chambers which neighbor each other in the circumferential direction of the central chamber Cc are disposed on the different levels, respectively. The diameter of the central chamber Cc is appropriately determined such that the two chambers, which neighbor each other in the circumferential direction of the central chamber Cc, and are disposed on the different levels, respectively, have portions overlapping each other. The state where the neighboring two chambers overlap each other means the state where the two chambers overlap each other when the vacuum processing apparatus A1 is viewed from the upper (or lower) position. In other words, the chambers C1 and C2 neighboring each other in the circumferential direction of the central chamber Cc shown in FIG. 1 are examples of the chambers which partially overlap each other. According to this overlapping relationship, the chamber C2 disposed on the upper level hides a portion of the chamber C1 disposed on the lower level when the vacuum processing apparatus A1 is viewed from the upper position. The chambers C1 and C2 do not entirely and completely overlap each other, but are not entirely spaced from each other. These chambers overlap only partially each other. The same relationship is kept, e.g., between the chambers C2 and C3, and between the chambers Ci and C1.

Figure 3:
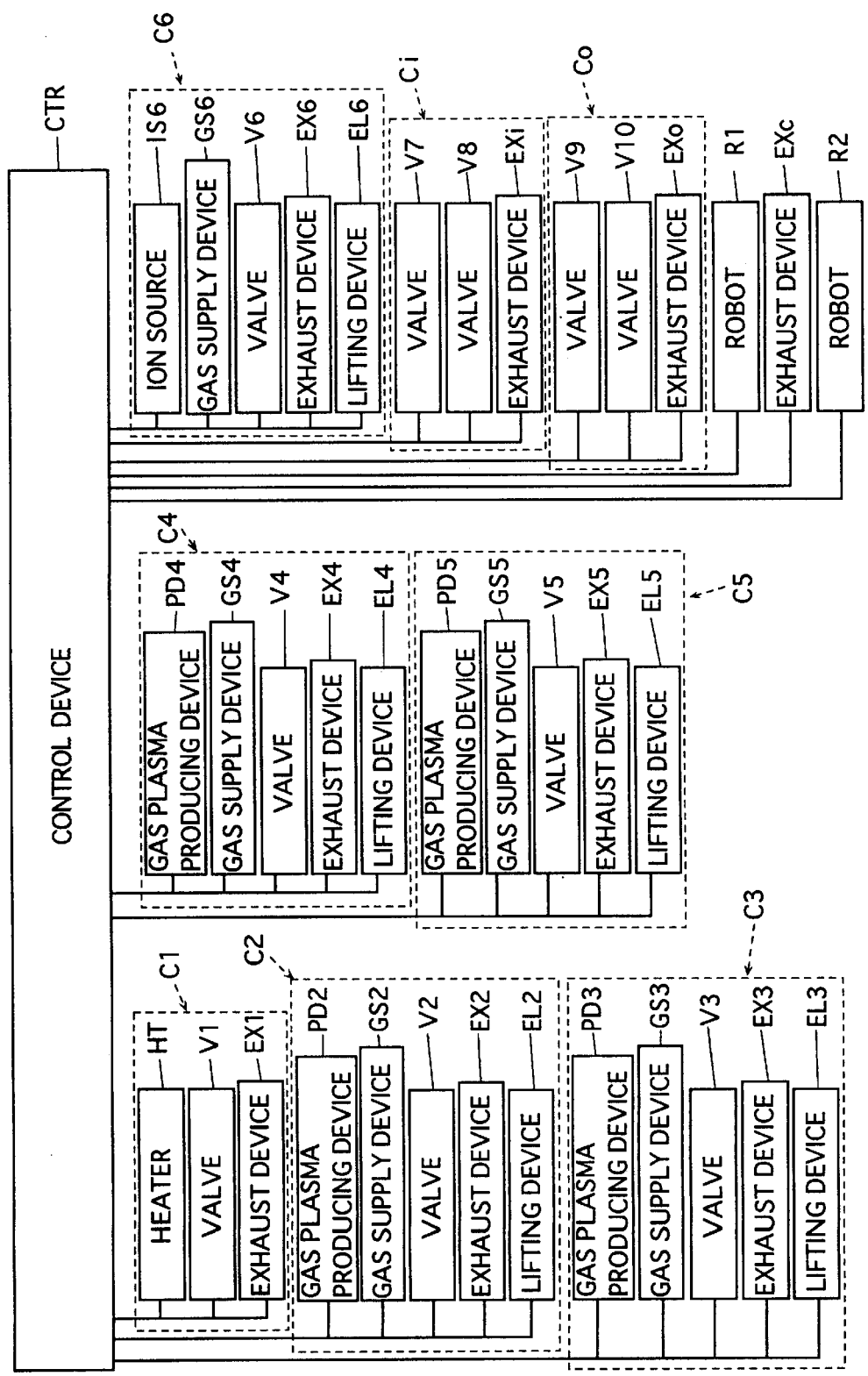
FIG. 3 is a block diagram showing connection between devices for performing several kinds of processing in the vacuum processing apparatus shown in FIG. 1.

The central chamber Cc has a hollow cylindrical form as already described, and a predetermined internal pressure (a gas pressure or a vacuum degree) can be achieved with an exhaust device EXc (see FIG. 3). In FIGS. 1 and 2, the exhaust device EXc is not shown. FIG. 3 is a schematic block diagram showing connection between instruments and devices provided for the vacuum processing apparatus A1.

As already described, the chamber C1 has a form of a hollow rectangular parallelepiped, and is internally connected with the central chamber Cc via a gate valve V1. Likewise, the chambers C2, C3, C4, C5 and C6 are internally connected with the central chamber Cc via gate valves V2, V3, V4, V5 and V6, respectively. Predetermined inner pressures can be achieved in the chambers C1–C6 with exhaust devices EX1–EX6 (see FIG. 3) provided for these chambers, respectively.

The chamber Ci, a hollow rectangular parallelepiped as already described, has an end internally connected with the central chamber Cc via a gate valve V7, and has the other end connected with the outside via a gate valve V8. Likewise, the chamber Co has an end internally connected with the central chamber Cc via a gate valve V9, and has the other end connected with the outside via a gate valve V10. Predetermined inner pressures can be achieved in the chambers Ci and Co with exhaust devices EXi and EXo (see FIG. 3), respectively.

In the vacuum processing apparatus A1, an unprocessed substrate S (target object) disposed in a cassette CS outside the apparatus is successively subjected to predetermined several kinds of processing in the following manner. The substrate S is transferred from the cassette CS into the chamber Ci, and then predetermined processing is successively effected on the substrate S in the chambers C1–C6. The substrate S thus processed is returned from the chamber Co to the cassette CS.

Transfer of the substrate S in the vacuum processing apparatus A1 is performed by a robot R1 disposed in the central chamber Cc. The robot R1 is not shown in FIGS. 2(A)–2(D). The robot R1 can transfer the substrate S between the central chamber Cc and each of the chambers C1–C6, Ci and Co connected with the central chamber Cc. Transfer between the chambers connected with the central chamber Cc is performed through the central chamber Cc.

The chamber Ci is an object inlet chamber for transferring the substrate S from the outside of the vacuum processing apparatus A1 into the apparatus A1. The chamber Co is an object outlet chamber for discharging the processed substrate S from the apparatus A1.

As already described, processing is effected on the substrate S in each of the chambers C1–C6. Each of the chambers C1–C6 is a processing chamber for processing the substrate S disposed therein. Each of the chambers C1–C6 is provided with a processing device for processing the substrate S. Before describing the processing devices arranged in the chambers C1–C6, description is given of an example of processing effected on the substrate S in the vacuum processing apparatus A1.

In this example, processing is effected for manufacturing a TFT for a liquid crystal display, and therefore a glass substrate is used as the substrate S. Five kinds of processing P1–P5 are successively effected on the substrate S in this order.

(Processing P1) The substrate S is heated to a predetermined temperature. In this example, the substrate S is heated to a temperature in a range from 250° C. to 400° C. This processing is performed as a pretreatment for processing P2–P4 to be performed later.

(Processing P2) A silicon oxide film is formed on the substrate S.

(Processing P3) An amorphous silicon film is formed on the substrate S.

(Processing P4) An $n^+$-type silicon film (n-type silicon semiconductor film) is formed on the substrate S.

(Processing P5) The substrate S subjected to processing P1–P4 is cooled. This processing is performed as a posttreatment of processing P1–P4.

As a result of processing P1–P5 successively effected on the substrate S, multiple layered films are formed on the substrate S.

Processing P1 is performed in the chamber C1. Processing P2 is performed in the chambers C2 and C3 in parallel. Processing P3 is performed in the chambers C4 and C5 in parallel. Processing P4 is performed in the chamber C6. Processing P5 is performed in the outlet chamber Co. The outlet chamber Co also serves as a processing chamber.

The processing chamber C1 for performing processing P1 (heating) is provided at its inner top, side and bottom surfaces with a heater HT. The processing chamber C1 is also provided with the exhaust device EX1 (see FIG. 3) for achieving the predetermined internal pressure as already described. A plurality of holders H11, H12, H13 and H14 (see FIG. 2(A)) are disposed within the processing chamber C1 for holding the substrate S. Thereby, the plurality of (four in this example) substrates S can be heated in the processing chamber C1 at a time.

The processing chamber C2 for processing P2 (formation of the silicon oxide film) is provided with a gas plasma producing device PD2 for forming the film by the plasma CVD method. The gas plasma producing device PD2 is partially disposed on the top portion of the chamber C2. The processing chamber C2 is also provided with a gas supply device GS2 (see FIG. 3) for supplying the plasma material gas for the silicon oxide film into the chamber. The processing chamber C2 is further provided with an exhaust device EX2 (see FIG. 3) for achieving the predetermined inner pressure as already described. A holder H2 for holding the substrate S is disposed in the processing chamber C2. The holder H2 can be moved vertically with a lifting device EL2 for transferring the substrate S to and from the robot R1. The lifting device EL2 is partially disposed at the bottom portion of the processing chamber C2.

In the processing chamber C2, the exhaust device EX2 achieves the predetermined inner pressure, and the gas supply device GS2 supplies a gas ($SiH_4+N_2O$ or $TEOS+O_3$ in this example) into the chamber for forming the silicon oxide film. The gas plasma producing device PD2 produces the plasma from the gas, and the substrate S is exposed to the plasma so that the silicon oxide film is formed on the substrate S.

The processing device arranged for the processing chamber C2 for effecting processing P2 on the substrate S includes the gas plasma producing device PD2, gas supply device GS2, exhaust device EX2 and lifting device EL2.

In parallel with processing P2 in the processing chamber C2, processing P2 is also performed in the processing chamber C3, which is provided with a gas plasma producing device PD3, a gas supply device GS3, and an exhaust device EX3, a holder H3 and a lifting device EL3, similarly to the processing chamber C2. Similarly to the foregoing structure, the gas plasma producing device PD3 is partially arranged on the top portion of the processing chamber C3. The lifting device EL3 is partially arranged at the bottom portion of the processing chamber C3. In the processing chamber C3, the silicon oxide film can be formed on the substrate S similarly to processing in the processing chamber C2.

In the processing chamber C4 for performing processing P3 (formation of the amorphous silicon film), the plasma CVD method is used, and therefore a gas plasma producing device PD4 is arranged. The gas plasma producing device PD4 is partially arranged on the top portion of the chamber C4. The processing chamber C4 is provided with a gas supply device GS4 (see FIG. 3) for supplying the material gas for the amorphous silicon film into the chamber C4. The processing chamber C4 is also provided with an exhaust device EX4 (see FIG. 3) for achieving the predetermined pressure in the chamber as already described. In the processing chamber C4, there is arranged a holder H4 for holding the substrate S. The holder H4 can be vertically moved with a lifting device EL4, which is partially arranged at the bottom portion of the processing chamber C4.

In the processing chamber C4, the exhaust device EX4 achieves the predetermined inner pressure, and the gas supply device GS4 supplies a gas ($SiH_4+H_2$ in this example) for forming the amorphous silicon film into the chamber. The gas plasma producing device PD4 produces the plasma from the gas so that the amorphous silicon film is formed on the substrate S disposed in the chamber.

In parallel with processing P3 in the processing chamber C4, processing P3 is also performed in the processing chamber C5, which is provided with a gas plasma producing device PD5, a gas supply device GS5, an exhaust device EX5, a holder H5 and a lifting device EL5, similarly to the processing chamber C4. Similarly to the foregoing structure, the gas plasma producing device PD5 is partially arranged on the top portion of the processing chamber C5. The lifting device EL5 is partially arranged at the bottom portion of the processing chamber C5. In the processing chamber C5, the amorphous silicon film can be formed on the substrate S similarly to processing in the processing chamber C4.

In the processing chamber C6 for performing processing P4 (formation of the $n^+$-type silicon film), an ion source IS6 is arranged for forming the film by the ion doping method. The ion source IS6 is partially disposed on the top portion of the chamber C6. The processing chamber C6 is also provided with a gas supply device GS6 (see FIG. 3) for supplying an ion material gas for the $n^+$-type silicon film into the chamber. The gas supply device GS6 may be arranged to supply the gas directly into the ion producing chamber of the ion source IS6. The processing chamber C6 is provided with an exhaust device EX6 (see FIG. 3) for achieving the predetermined pressure in the chamber as already described. A holder H6 for holding the substrate S is arranged in the processing chamber C6. The holder H6 can be moved vertically with the lifting device EL6. The lifting device EL6 is partially disposed at the bottom portion of the processing chamber C6.

In the processing chamber C6, the exhaust device EX6 achieves the predetermined inner pressure, and the gas supply device GS6 supplies a gas ($SiH_4+PH_3+H_2$ in this example) into the chamber for forming the $n^+$-type silicon film. The gas is ionized with the ion source IS6 so that the amorphous silicon film, which is already formed on the substrate S disposed in the chamber, is doped with n-type impurities, and thereby the $n^+$-type silicon layer can be formed.

The processing chamber C1 is provided on its top portion with a lid L1. The lid L1 can be opened for having access to the inside of the processing chamber C1.

Figure 4:
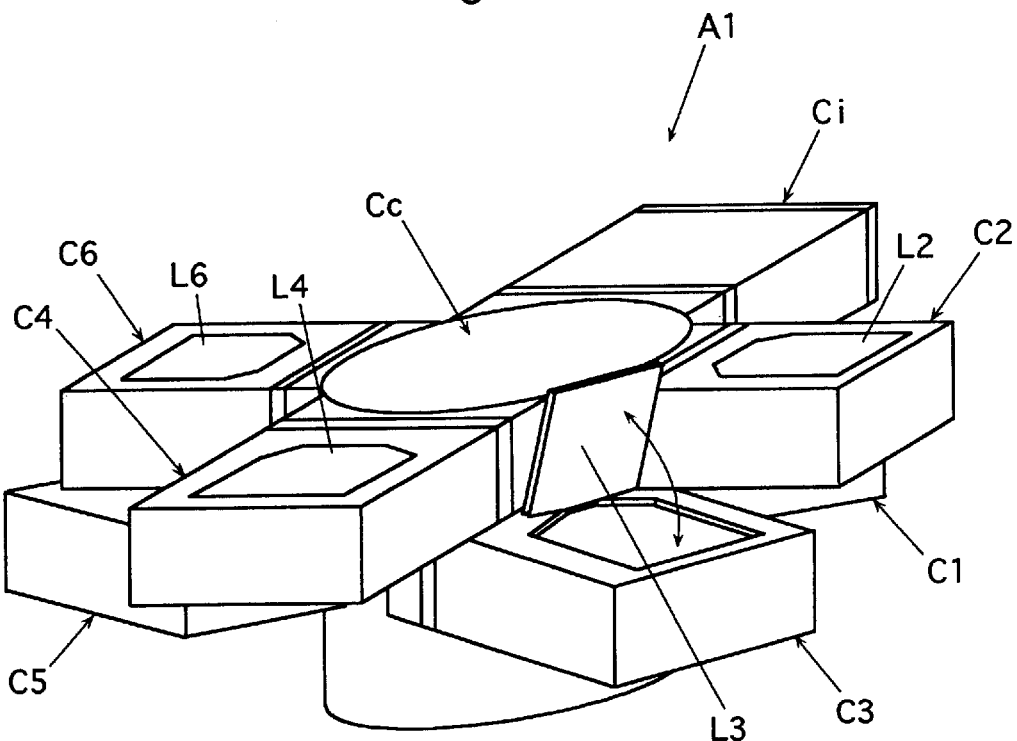
FIG. 4 is a schematic perspective view showing the vacuum processing apparatus shown in FIG. 1, and particularly showing a state where a lid formed on the top portion of the processing chamber is in an open position.
Figure 8:
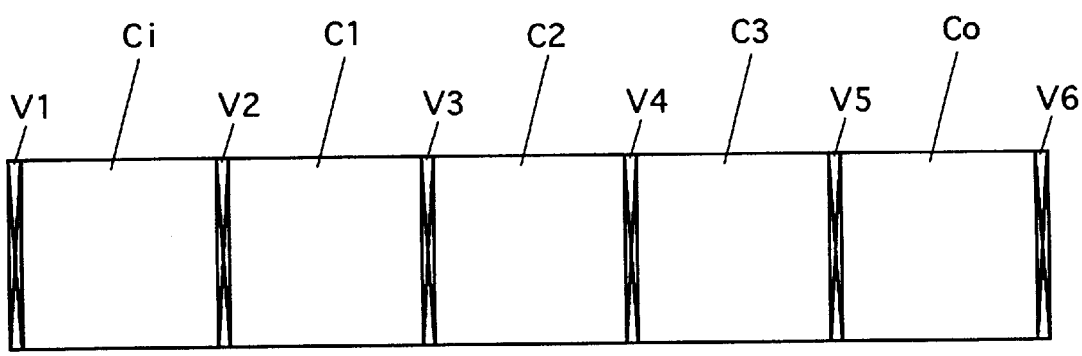
FIG. 8 is a schematic plan of an example of a vacuum processing apparatus in the prior art.

Similarly, the processing chambers C2, C3, C4, C5 and C6 are provided on their top portions with lids L2, L3, L4, L5 and L6, respectively. The gas plasma producing device PD2 arranged on the top portion of the processing chamber C2 is located on the lid L2. Similarly, the gas plasma producing devices PD3, PD4 and PD5 and the ion source IS6 arranged on the top portions of the processing chambers C3, C4, C5 and C6 are disposed on the lids L3, L4, L5 and L6, respectively. These lids L2–L6 can be opened by removing the devices located thereon, like the lid L3 in FIG. 4. In the state shown in FIG. 4, the devices disposed on the top portions of the processing chambers are temporarily removed. FIG. 4 does not show the lifting devices disposed at the bottom of the processing chambers.

The devices and instruments arranged for the respective processing chambers are connected with a control device CTR as shown in FIG. 3, and can operate under the control of the control device CTR. The control device CTR also controls operations of the transfer robot R1 disposed in the central chamber Cc and a robot R2 on the atmosphere side, i.e., outside the vacuum processing apparatus A1.

Owing to the above structures, each processing chamber can achieve the predetermined inner pressure independently of the other chambers. In each processing chamber, predetermined processing can be effected on the substrate S independently of processing in the other chambers. Accordingly, same processing (e.g., processing P2) can be performed in parallel, e.g., in the processing chambers C2 and C3.

In the vacuum processing apparatus A, the several kinds of processing P1–P4 can be successively performed in the following manner.

The plurality of substrates S are disposed in the cassette CS outside the vacuum processing apparatus A1.

First, the valve V8 of the inlet chamber Ci is opened, and the robot R2 transfers one of the substrates S from the cassette CS into the chamber Ci. The four substrates S are successively transferred into the chamber Ci. In the chamber Ci, the substrates S are held on the holders Hi1–Hi4 (see FIG. 2(D)). The robot R2 has a substrate holding portion RM2 which can pivot and move vertically for transferring a substrate.

Then, the valve V8 is closed, and the exhaust device EXi achieves the predetermined pressure in the chamber Ci. Predetermined pressures are also achieved in the central chamber Cc, the processing chambers C1–C6 and the outlet chamber Co with the corresponding exhaust devices, respectively.

The robot R1 arranged in the central chamber Cc successively transfers the four substrates S from the inlet chamber Ci into the processing chamber C1 for holding them on the holders H11–H14, respectively. Transfer of the substrates S is performed through the central chamber Cc. The gate valve arranged between each chamber and the central chamber Cc is opened and closed every time each substrate is to be transferred into or from each chamber connected with the central chamber Cc, unless otherwise specified.

In the processing chamber C1, the heater HT performs the pretreatment (processing P1) of heating the substrate S. This heating is performed simultaneously on the four substrates.

The substrate S already subjected to the pretreatment is transferred by the robot R1 to the processing chamber C2 or C3 for processing P2 of forming the silicon oxide film. Transfer of the substrate S between the robot R1 and the holder H2 in the processing chamber C2 is performed by cooperation of the robot R1 and the lifting device EL2 which can vertically move the holder H2. Between the robot R1 and the holder H3 in the processing chamber C3, the substrate S is transferred in a similar manner. The substrate holding portion RM1 of the robot R1 can pivot and vertically move for transferring the substrate to and from the holder in each chamber. In the processing chambers C2 and C3, the silicon oxide film is formed on the substrate S as described before. Formation of the silicon oxide film is performed on the single substrate at a time in each of the processing chambers C2 and C3.

The substrate S already subjected to processing of forming the silicon oxide film is transferred to the processing chamber C4 or C5 for performing processing P3 of forming the amorphous silicon film. In the processing chambers C4 and C5, the amorphous silicon film is formed on the substrate S in the manner already described. Forming of the amorphous silicon film is performed on the single substrate at a time in each of the processing chambers C4 and C5.

The substrate S already subjected to processing of forming the amorphous silicon film is transferred to the processing chamber C6 for forming the $n^+$-type silicon film. In the processing chamber C6, the $n^+$-type silicon film is formed on the substrate S in the manner already described. Forming of the $n^+$-type silicon film in the processing chamber C6 is performed on the single substrate at a time.

The substrate S already subjected to formation of the $n^+$-type silicon film is transferred to the outlet chamber Co. The substrate S is returned by the robot R2 to the cassette CS after being cooled in the outlet chamber Co.

In this manner, the substrate S can be continuously subjected to processing P1–P5. The pretreatment (processing P1) is effected on the four substrates S at a time so that the throughput can be improved. Since processing P2 requiring a relatively long time is performed in parallel in the processing chambers C2 and C3, the throughput can also be increased. Similarly to processing P2, processing P3 requiring a long processing time is performed in parallel in the processing chambers C4 and C5 so that the throughput can be increased.

Since processing P2 is performed in parallel, processing can be performed in one of the processing chambers C2 and C3 even when a trouble occurs in the processing device provided for the other of the chambers C2 and C3 for processing P2, or even when the maintenance work is to be performed in the other of the processing chambers C2 and C3 or the processing device provided therein. Even in this case, therefore, the vacuum processing apparatus A1 can successively perform processing P1–P4 on the substrate, and the total stoppage of processing can be suppressed. The same is true also with respect to processing P3.

According to the vacuum processing apparatus A1 of the invention, as already described, the chambers disposed around the central chamber Cc are divided into two groups disposed on two different levels, respectively, and any two chambers neighboring each other in the circumferential direction of the central chamber are disposed such that these two chambers are on different levels and partially overlap each other. Therefore, the following advantages can be achieved.

Since two neighboring chambers overlap only partially each other, a space is left on the top of each of the chambers C1, C3, C5 and Co disposed on the lower first level. By utilizing this space on the top, an instrument and/or a device can be disposed on the top portion of a lower chamber. For example, the gas plasma producing device PD2 described above is disposed on the top portion of the processing chamber C2. Since the space on the top of a chamber disposed on the lower first level can be utilized, the whole vacuum processing apparatus A1 can be made compact.

Figure 10A:
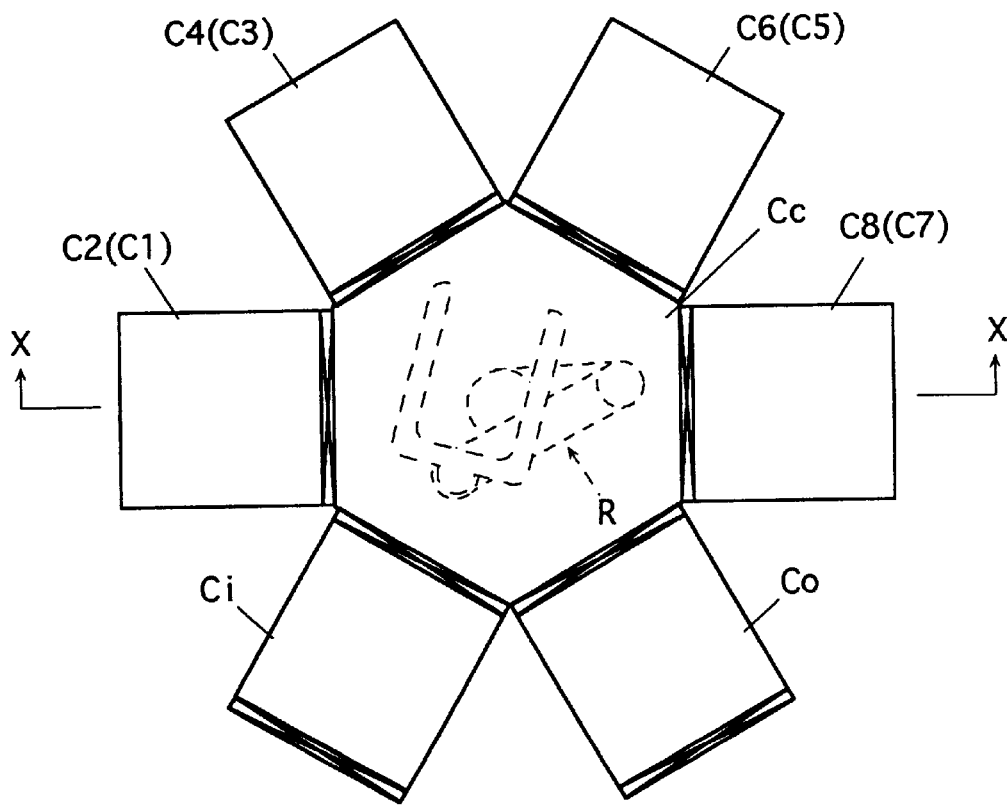
FIG. 10(A) is a schematic plan of still another example of a vacuum processing apparatus in the prior art.
Figure 10B:
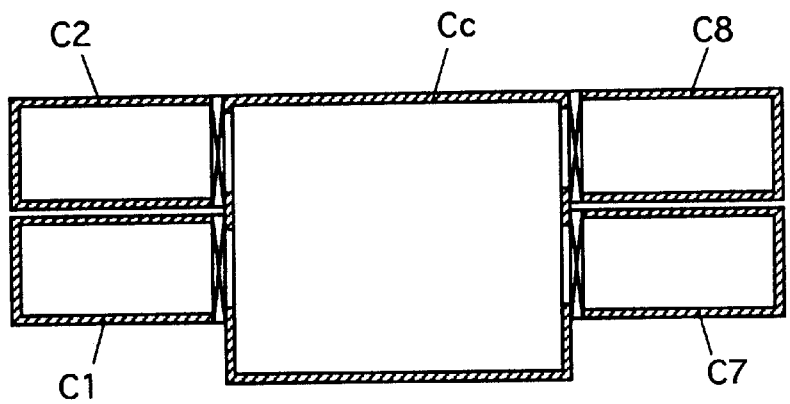
FIG. 10(B) is a schematic cross section of the vacuum processing apparatus taken along line X—X in FIG. 10(A).

A lid arranged on the top of a lower chamber can be opened and closed, e.g., as shown in FIG. 4 showing the lid L3, by removing an instrument disposed on the lid to an appropriate extent without moving any of the upper nor lower chamber. Accordingly, the vacuum processing apparatus A1 of the invention does not require a moving mechanism, which is required in the conventional vacuum processing apparatus shown in FIGS. 10(A) and 10(B) for moving a chamber on the upper or lower level to a large extent. Therefore, the vacuum processing apparatus A1 according to the invention can be inexpensive. In the conventional vacuum processing apparatus shown in FIGS. 10(A) and 10(B), a large space for moving a chamber on the upper or lower level to a large extent is required radially outside the chambers disposed around the central chamber. The vacuum processing apparatus A1 according to the invention does not require such a large space, but requires substantially a small area for installation. Since the vacuum processing apparatus A1 is disposed in a clean room of which a cost per unit area is high, the above reduction in substantial installation area results in reduction in a processing cost per substrate.

A space is also formed under the bottom of each of the chambers C2, C4, C6 and Ci disposed on the upper second level. By utilizing the space under the bottom, an instrument and/or a device can be disposed under the bottom of an upper chamber. Since the space under the bottom of a chamber disposed on the upper second level can be utilized, the whole vacuum processing apparatus A1 can be made further compact.

By utilizing the space under the bottom, the lifting device EL2 is disposed under the bottom portion of the chamber C2. The lifting device EL2 is provided for vertically moving the holder H2 as already described. Since the lifting device EL2 is disposed under the bottom portion of the chamber C2, the lifting device EL2 can act upward on the holder H2 for vertically moving the holder H2. In the conventional vacuum processing apparatus shown in FIGS. 10(A) and 10(B), the lifting device provided, e.g., for the chamber C2 disposed on the upper level must be disposed on the side of the chamber because no space is left under the chamber, and the lifting device must act laterally on the holder for vertically moving the holder. The vacuum processing apparatus A1 of the invention can employ the lifting device which has a more simple and less expensive structure than the conventional vacuum processing apparatus shown in FIGS. 10(A) and 10(B).

Figure 9A:
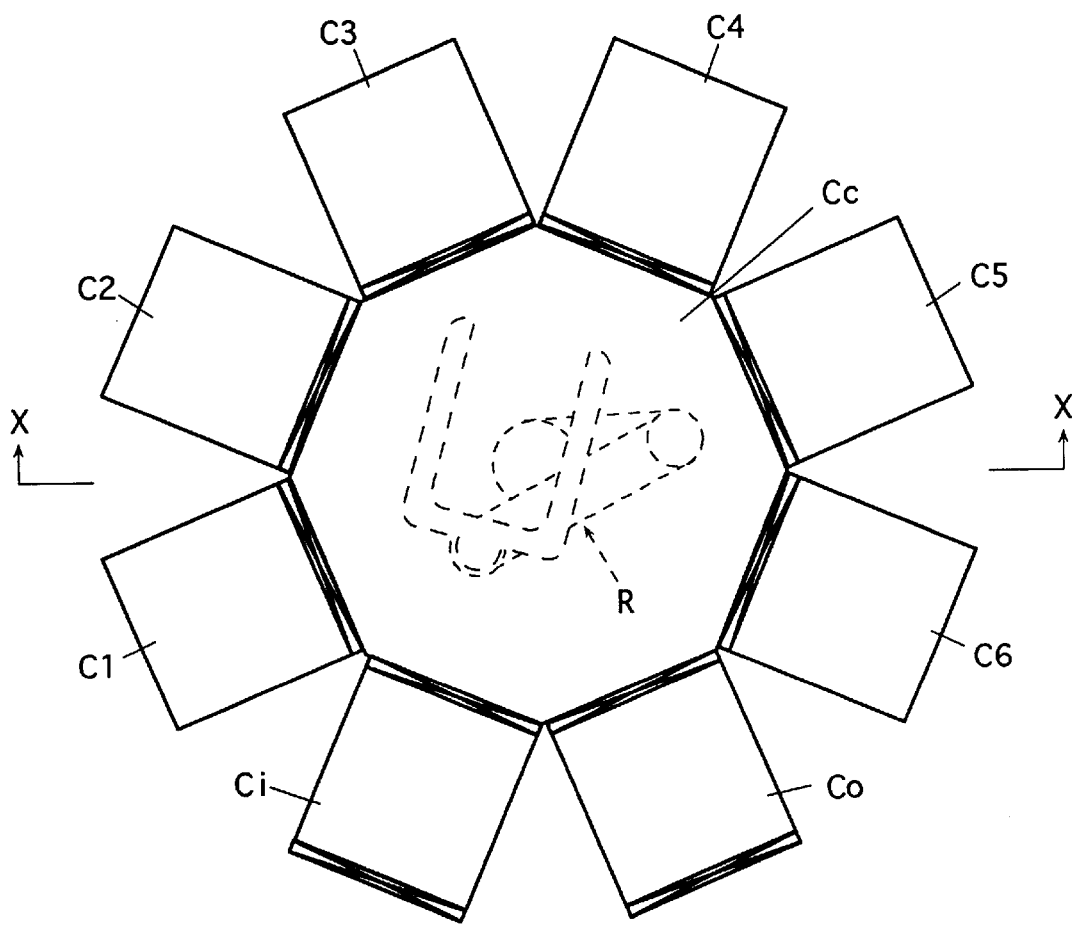
FIG. 9(A) is a schematic plan of another example of a vacuum processing apparatus in the prior art.
Figure 9B:
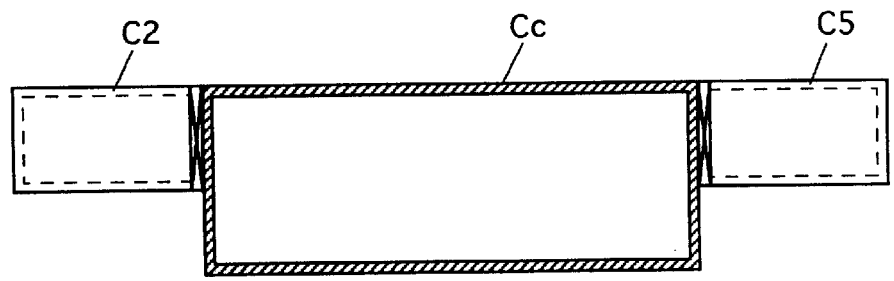
FIG. 9(B) is a schematic cross section of the vacuum processing apparatus taken along line X—X in FIG. 9(A)

Further, neighboring two chambers are not completely spaced from each other, but overlap partially each other. Therefore, the central chamber Cc can have a small radial size, which also results in a compact structure of the whole vacuum processing apparatus A1. The vacuum processing apparatus A1 of the invention, which is provided with eight chambers connected with the central chamber, requires a small installation area equal to about 65%–75% of that required for the conventional vacuum processing apparatus having a single-level structure shown in FIGS. 9(A) and 9(B). Further, the robot disposed in the central chamber requires a small stroke equal to about 60% of that in the prior art.

(2) In the vacuum processing apparatus A1, the processing devices arranged in the processing chambers C1–C6 can be partially or entirely replaced with some other devices, parts or the like. Processing other than processing P1–P4 can be effected on a substrate (i.e., a target object).

For example, processing P1'–P6' described below can be successively performed as a part of the pattern forming process used for an LSI. A substrate S' is an Si wafer which is already provided with a TiN film (a metal barrier layer) and an Al film or a Cu film. A resist pattern is formed by a lithography method on the Si wafer coated with these metal films.

(Processing P1') Dry etching is effected to remove the Al or Cu not covered with the resist from the substrate S'.
(Processing P2') Dry etching is effected to remove the TiN not covered with the resist from the substrate S'.

(Processing P3') The resist is removed by ashing from the substrate S'. Thereafter, passivation is effected on the metal surface for preventing corrosion.

(Processing P4') A silicon oxide film is formed on the substrate S'.

(Processing P5') A semiconductor polycrystalline silicon film is formed on the substrate S'.

(Processing P6') The substrate S' is cooled.

For performing processing P1', P2', P3', P4', P5' and P6' in the processing chambers C2, C3, C4, C5, C6 and Co, respectively, the following processing devices may be arranged in the respective chambers.

Instead of the gas plasma producing devices PD2 and PD3, the processing chambers C2 and C3 may be provided with etching devices or ECR etching devices, e.g., using parallel-plane opposed electrodes, respectively. Instead of the gas plasma producing device PD4, the processing chamber C4 may be provided with a source of ultraviolet light, ozone or oxygen plasma for ashing. The gas plasma producing device PD5 in the processing chamber C5 can be used, as it is, for forming the silicon oxide film. The ion source IS6 in the processing chamber C6 can be used, as it is, as an ion source for ion irradiation which is performed for crystallizing an amorphous silicon film to form the polycrystalline silicon film, or for doping the amorphous silicon film with impurities for forming the semiconductor. Further, a device for forming the amorphous silicon film by the plasma CVD method is added. The heater HT of the processing chamber C1 is used for preheating before film formation.

Figure 5A:
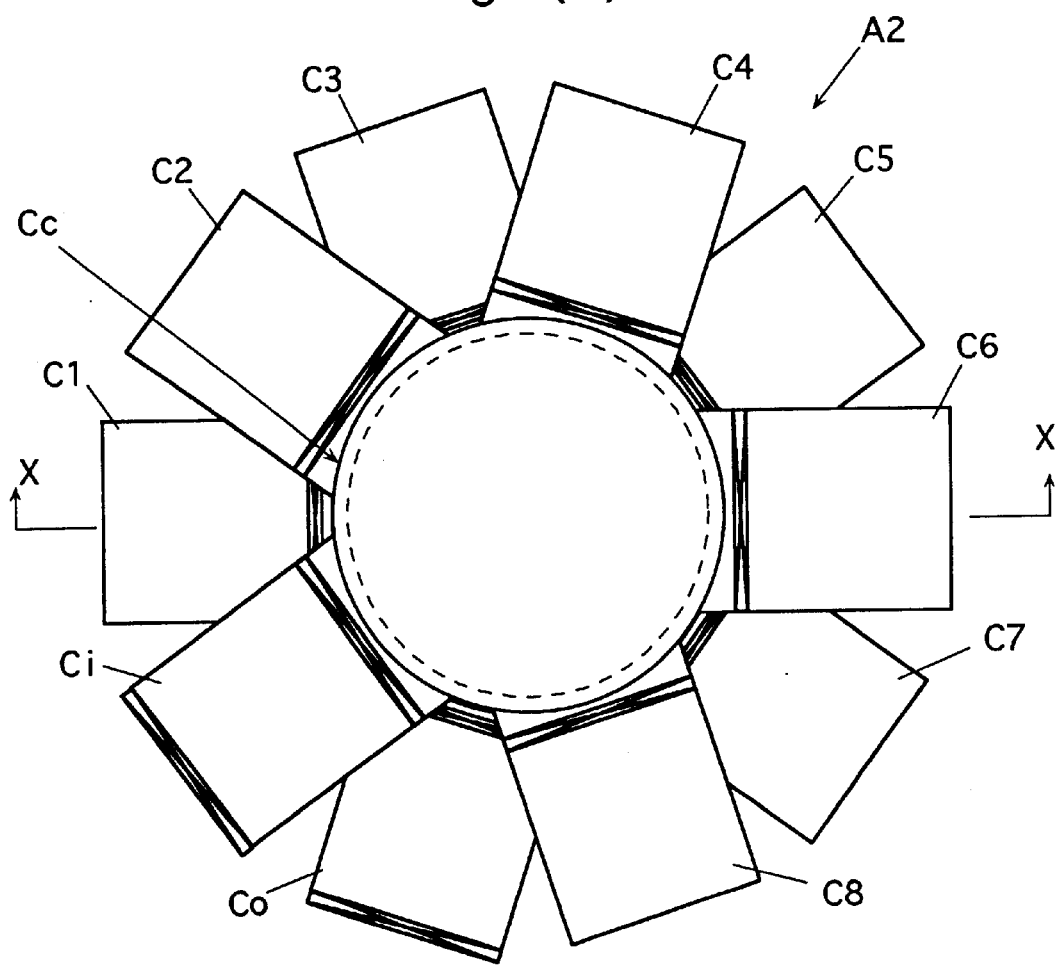
FIG. 5(A) is a schematic plan showing another example of the vacuum processing apparatus according to the invention.
Figure 5B:
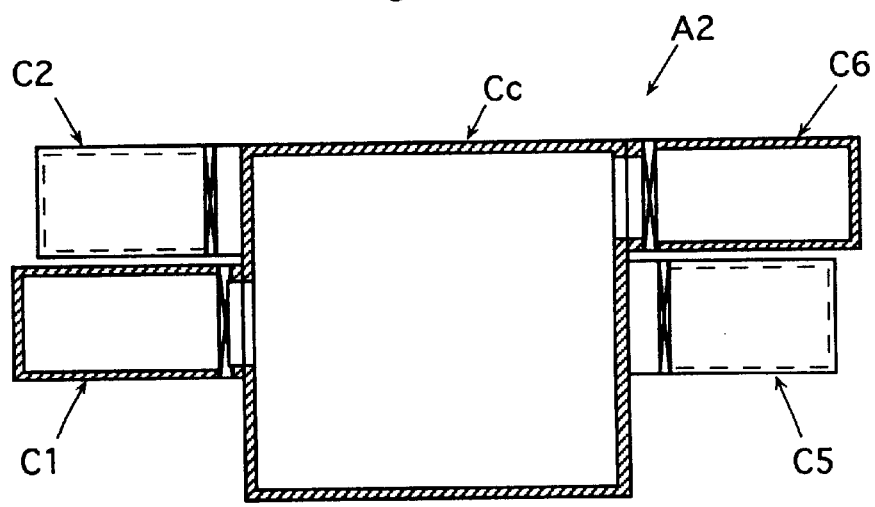
FIG. 5(B) is a schematic cross section of the vacuum processing apparatus taken along line X—X in FIG. 5(A)

(3) Although the vacuum processing apparatus A1 described above includes eight chambers disposed around the central chamber, the number thereof is not restricted to eight. By arranging more chambers around the central chamber, more kinds of processing can be successively effected on a target object. A vacuum processing apparatus A2 in which ten chambers are arranged around a central chamber is shown in FIGS. 5(A) and 5(B). FIG. 5(A) is a plan of the vacuum processing apparatus A2, and FIG. 5(B) is a schematic cross section of the vacuum processing apparatus A2 taken along line X—X in FIG. 5(A).

The vacuum processing apparatus A2 is provided with the central chamber Cc, the processing chambers C1–C8 which are disposed around the central chamber Cc and are connected thereto, the inlet chamber Ci and the outlet chamber Co.

The chambers C1–C8, Ci and Co are divided into two groups, which are disposed on the upper second and the lower first levels, respectively. The chambers C1, C2, C5, C7 and Co are disposed on the lower first level. The chambers C2, C4, C6, C8 and Ci are disposed on the upper second level. Two chambers which neighbor each other in the circumferential direction of the central chamber Cc are disposed on the different levels, respectively, and have portions overlapping each other.

Owing to the above arrangement, the vacuum processing apparatus A2 can substantially or practically have a small installation area, similarly to the vacuum processing apparatus A1.

(4) In the vacuum processing appatatuses A1 and A2, any two neighboring chambers disposed around the central chamber are disposed on the different levels, respectively, and overlap only partially each other. Some chambers such as an inlet chamber and an outlet chamber do not require processing devices to be arranged on the top or at the bottom portions, nor do those require lids on the top portions. Those chambers may be disposed such that a chamber entirely or almost entirely overlaps with another chamber.

Figure 6:
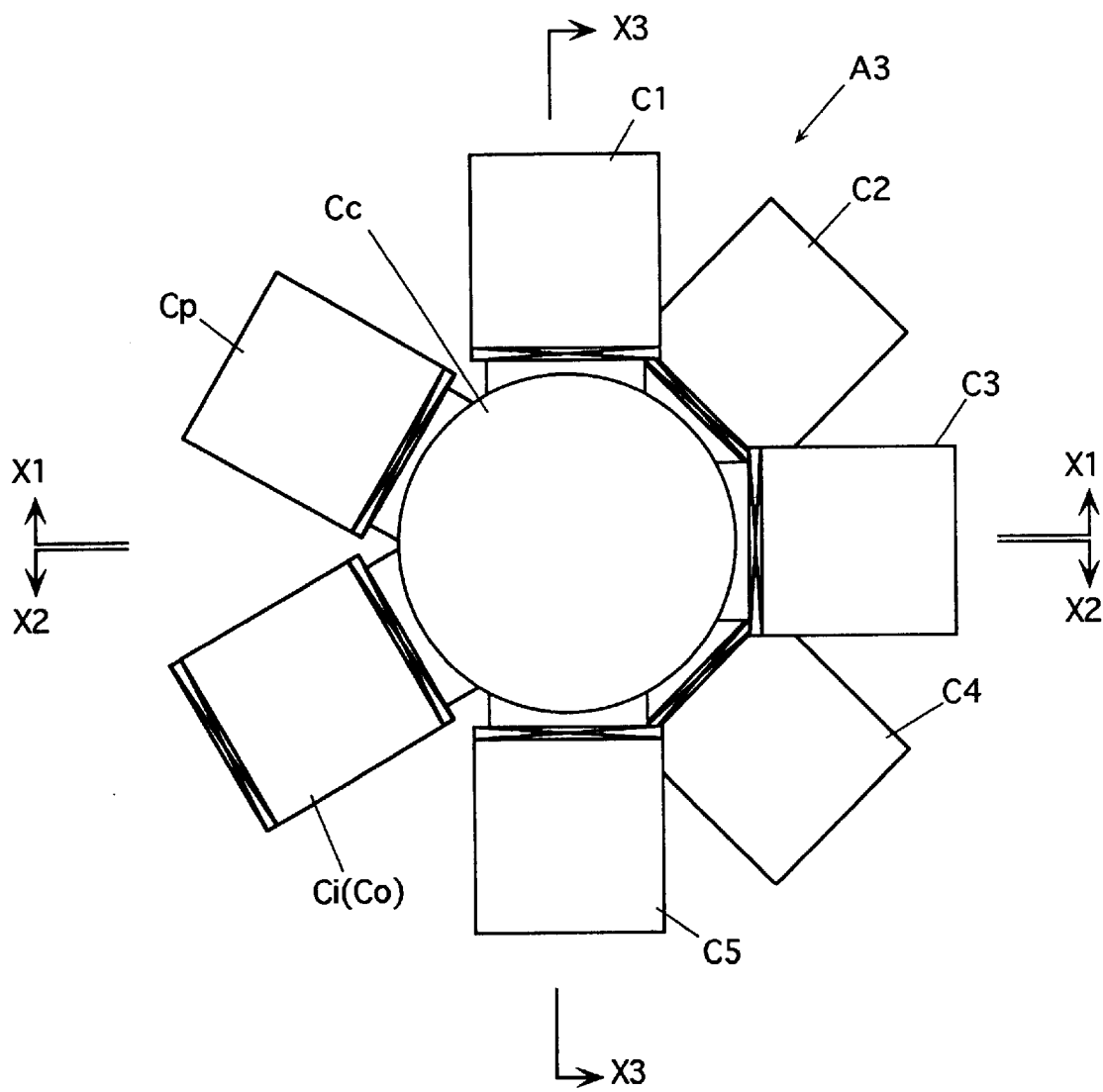
FIG. 6 is a schematic plan of still another example of the vacuum processing apparatus according to the invention.
Figure 7A:
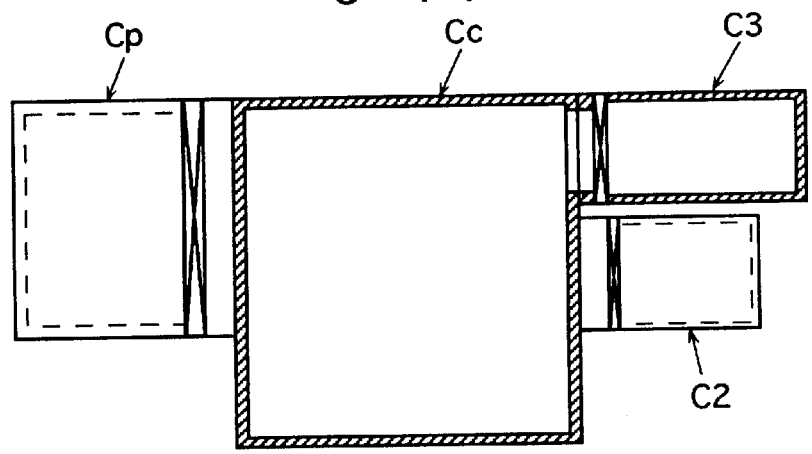
FIGS. 7(A), 7(B) and 7(C) are schematic cross sections of the vacuum processing apparatus shown in FIG. 6 taken along lines X1—X1, X2—X2 and X3—X3, respectively.
Figure 7B:
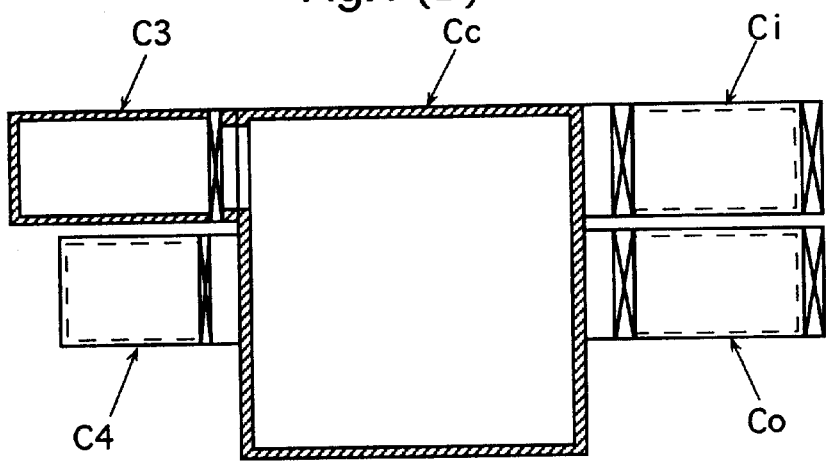
Figure 7C:
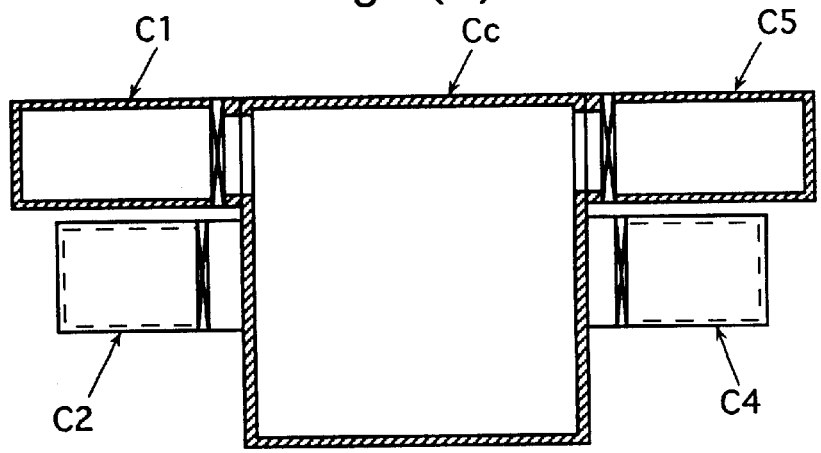

If a pretreatment or a post-treatment is to be effected on many objects at a time, such a chamber may be disposed over a plurality of levels for increasing chamber capacity. The example of this structure is employed in a vacuum processing apparatus A3 shown in FIGS. 6, 7(A), 7(B) and 7(C). FIG. 6 is a schematic plan of the vacuum processing apparatus A3. FIGS. 7(A), 7(B) and 7(C) are schematic cross sections of the vacuum processing apparatus A3 taken along lines X1—X1, X2—X2 and X3—X3 in FIG. 6, respectively.

In the vacuum processing apparatus A3, the processing chambers C1–C5, pretreatment chamber Cp, inlet chamber Ci and outlet chamber Co are disposed around the central chamber Cc.

The processing chambers C1–C5 are divided into two groups on the lower first level and the upper second level, and neighboring two chambers on the different levels overlap only partially each other. The processing chamber C1 does not overlap with the pretreatment chamber Cp. The processing chamber C5 does not overlap with the chamber Ci nor Co.

The outlet and inlet chambers Co and Ci are disposed on the lower first level and the upper second level, respectively, and are vertically aligned each other. Owing to the vertical alignment of the chambers Co and Ci, the vacuum processing apparatus A3 can be made compact. The outlet chamber Co disposed on the lower first level does not require a lid on the top portion. Likewise, the inlet chamber Ci disposed on the upper second level does not require arrangement of a large instrument at its bottom portion. Therefore, the vertical alignment thereof does not cause any problem.

The pretreatment chamber Cp for performing the pretreatment on a plurality of objects is arranged over the lower first level and the upper second level. Since the pretreatment chamber Cp has a large capacity, many objects can be simultaneously disposed in the chamber Cp so that the pretreatment can be simultaneously effected on many objects. The treatment is efficiently done.

In the vacuum processing apparatus A3, since the processing devices or the like can likewise be disposed on the top or at the bottom portions of the processing chambers C1–C5, the whole apparatus can be made compact.

In the vacuum processing apparatuses A1–A3 described above, the chambers disposed around the central chamber are on the two different levels. However, the chambers can be disposed on three or more different levels.

Industrial Applicability

The invention can be used, e.g., for successively effecting multiple kinds of processing such as etching, film formation and ion irradiation on an object.

What is claimed is:

1. A vacuum processing apparatus comprising:

a plurality of processing chambers provided with processing devices for effecting predetermined processing on a target object to be processed, being capable of achieving predetermined internal pressures, and being capable of accommodating said target object for effecting predetermined processing under the predetermined pressures, wherein said plurality of processing chambers are arranged around a central chamber provided for object transfer and being capable of achieving a predetermined internal pressure, and are connected with said central chamber, and said plurality of chambers are disposed on two or more vertically different levels, and each of said processing chambers and a processing chamber neighboring thereto in the circumferential direction of said central chamber are disposed on different levels, respectively, and overlap only partially each other.

2. The vacuum processing apparatus according to claim 1, wherein the processing device entirely or partially attached to the outer side of said processing chamber is entirely or partially arranged on the top or at the bottom portion of said processing chamber.

3. The vacuum processing apparatus according to claim 1, wherein at least one of said processing chambers is provided on its top portion with an openable lid.

4. The vacuum processing apparatus according to claim 1, further comprising:

a pretreatment chamber being capable of accommodating a plurality of objects, provided with a pretreatment device for effecting a predetermined pretreatment on each object prior to processing in said processing chamber, being capable of achieving a predetermined internal pressure, and being connected with said central chamber.

5. The vacuum processing apparatus according to claim 4, wherein said pretreatment chamber and a processing chamber neighboring thereto in the circumferential direction of said central chamber are disposed on different levels, respectively, and overlap only partially each other.

6. The vacuum processing apparatus according to claim 1, further comprising:

a post-treatment chamber being capable of accommodating a plurality of objects, provided with a post-treatment device for effecting a predetermined post-treatment on each object after processing in said processing chamber, being capable of achieving a predetermined internal pressure, and being connected with said central chamber.

7. The vacuum processing apparatus according to claim 6, wherein said post-treatment chamber and a processing chamber neighboring thereto in the circumferential direction of said central chamber are disposed on different levels, respectively, and overlap only partially with each other.

8. The vacuum processing apparatus according to claim 1, further comprising:

an inlet chamber being capable of accommodating one or more objects, being capable of achieving a predetermined internal pressure, and being connected with said central chamber for transferring said object into said central chamber.

9. The vacuum processing apparatus according to claim 8, wherein said inlet chamber and a chamber neighboring thereto in the circumferential direction of said central chamber are disposed on different levels, respectively, and overlap only partially each other.

10. The vacuum processing apparatus according to claim 1, further comprising:

an outlet chamber being capable of accommodating one or more objects, being capable of achieving a predetermined internal pressure, and being connected with said central chamber for discharging said object from said central chamber.

11. The vacuum processing apparatus according to claim 10, wherein said outlet chamber and a chamber neighboring thereto in the circumferential direction of said central chamber are disposed on different levels, respectively, and overlap only partially with each other.

12. The vacuum processing apparatus according to claim 1, further comprising:

an inlet chamber being capable of accommodating one or more objects, being capable of achieving a predetermined internal pressure, and being connected with said central chamber for transferring said object into said central chamber; and an outlet chamber being capable of accommodating one or more objects, being capable of achieving a predetermined internal pressure, and being connected with said central chamber for discharging said object from said central chamber, wherein said inlet and outlet chambers overlap with each other, and are disposed on different levels, respectively.

13. The vacuum processing apparatus according to claim 1, wherein said processing device provided in each of said processing chambers can effect predetermined processing on an object independently of any processing device provided for the other processing chambers.

14. The vacuum processing apparatus according to any one of the preceding claims 1 through 13, wherein a predetermined pressure can be achieved in each of said chambers independently of the other chambers.

15. The vacuum processing apparatus according to any one of the preceding claims 1 through 13, wherein said central chamber is provided with a transfer robot for transferring said object between said central chamber and each of said chambers connected with said central chamber.

* * * * *